United States Patent [19]

Onyon

[11] Patent Number: 4,823,000
[45] Date of Patent: Apr. 18, 1989

[54] APPARATUS FOR INDICATING THE VALUE OF A VARIABLE

[75] Inventor: Peter D. Onyon, Leicester, United Kingdom

[73] Assignee: Rank Taylor Hobson Limited, England

[21] Appl. No.: 100,020

[22] Filed: Sep. 23, 1987

[30] Foreign Application Priority Data

Oct. 3, 1986 [GB] United Kingdom ............... 8623752

[51] Int. Cl.$^4$ ............................................. G01D 5/34
[52] U.S. Cl. ........................ 250/231 SE; 250/237 G
[58] Field of Search ............ 250/231 SE, 237 G, 208, 250/209; 356/374, 395; 340/347 P; 364/723

[56] References Cited

U.S. PATENT DOCUMENTS 4,346,447 8/1982 Takahama .................... 250/231 SE
4,445,110 4/1984 Breslow .......................... 340/347 P
4,630,928 12/1986 Klingler et al. ................ 250/237 G

FOREIGN PATENT DOCUMENTS 0024969 3/1981 European Pat. Off. .
1161561 8/1966 United Kingdom .

Primary Examiner—David C. Nelms
Attorney, Agent, or Firm—Lerner, David, Littenberg, Krumholz & Mentlik

[57] ABSTRACT

In a position encoder an interpolator derives from quadrature input signals a series of sine waves equispaced in phase. These are applied to respective comparators which output a binary zero or a binary one according to whether the respective sine wave is above or below the zero crossing point. Interpolation is achieved by identifying an adjacent pair of said sine waves of which one has a value above and the other a value below zero and a counter stores a number indicative of this pair of signals.

15 Claims, 3 Drawing Sheets

APPARATUS FOR INDICATING THE VALUE OF A VARIABLE

This invention relates to apparatus for indicating the value of a variable. The invention is particularly applicable to interpolators, for example for use in position encoders.

In a known form of interpolator, a series of sine waves equispaced in phase is derived from quadrature sine wave input signals, and interpolation is performed by applying the series of sine waves to respective comparators whose outputs indicate whether the magnitude of the respective input is above or below zero. A counter registers a count each time any comparator output changes, the direction of the count being dependent upon the direction of change of the comparator output. The problem with the known circuit is that if a spurious pulse is counted, the count thereafter remains permanently in error.

In one aspect, the present invention provides an interpolator having means for detecting errors in a count representing an interpolation and providing a correction for any detected error.

In another aspect, the invention provides an interpolator in which an output count representing the interpolation is derived from a circuit which is responsive to the actual values of the outputs of a plurality of comparators, rather than, as in the prior art, being responsive only to changes in said values.

The invention is described further by way of example with reference to the accompanying drawings in which.

Figure 1:
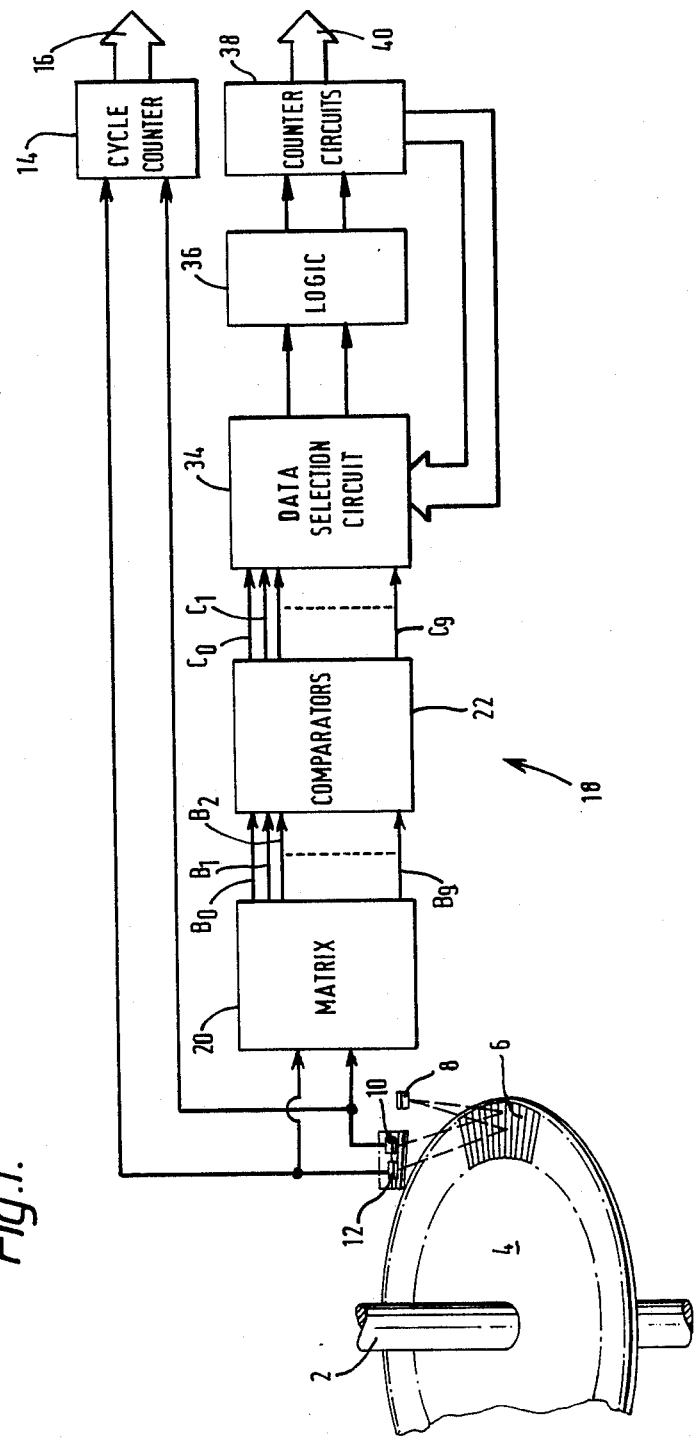
FIG. 1 is a diagram showing a preferred embodiment of the invention.
Figure 2:
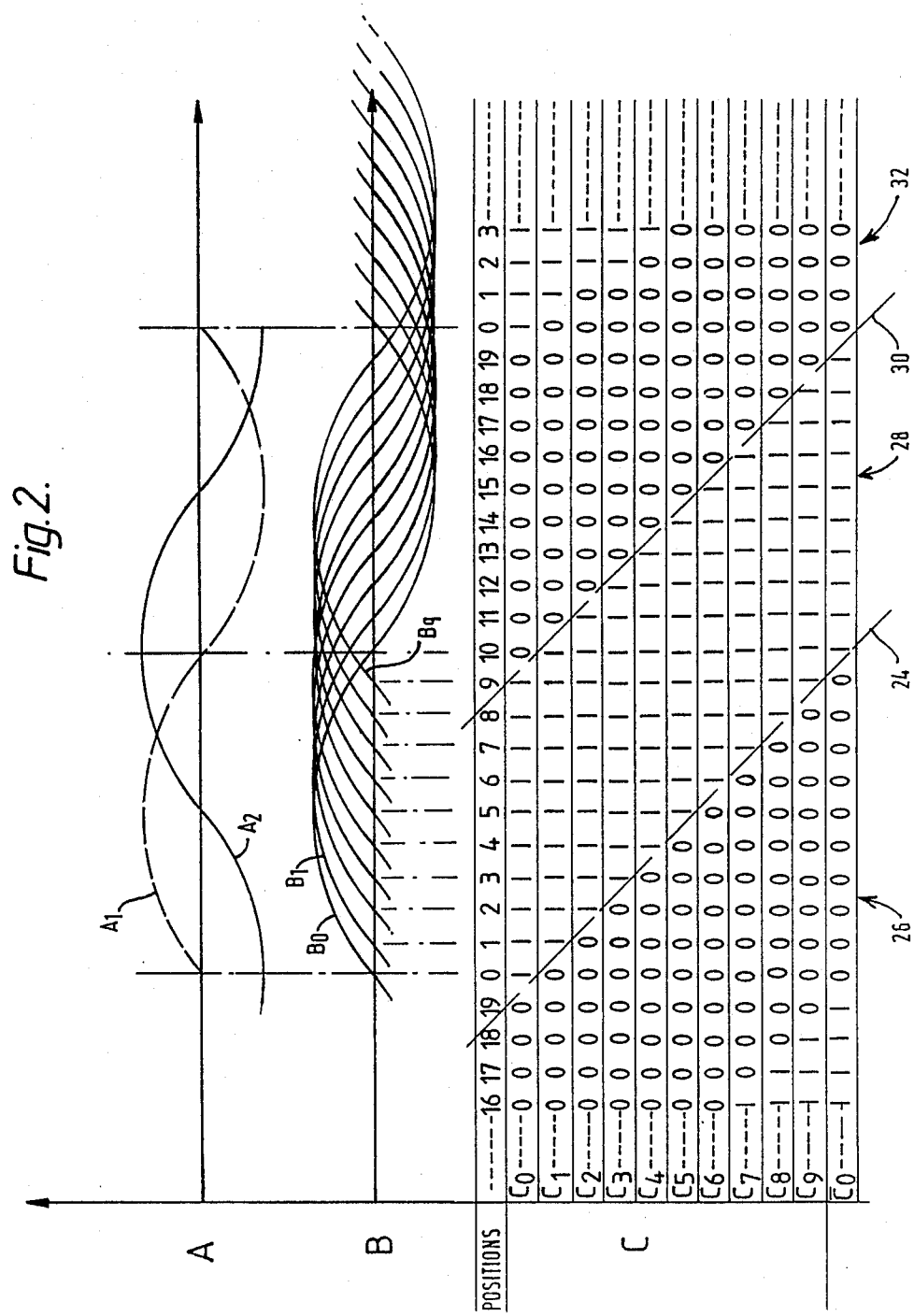
FIG. 2 is a waveform diagram and a table for explaining the operation of the embodiment of FIG. 1.

With reference to FIG. 1, a shaft 2, whose rotational position is to be monitored, is provided with a disc 4, secured to the shaft 2 and having an optical grating 6 around its edge. The grating 6 is illuminated by light from a light source 8 which is reflected to first and second transducers 10 and 12 positioned to produce quadrature output signals upon movement of the grating 6 when the shaft 2 is rotated. These quadrature signals A1 and A2, which are illustrated at A in FIG. 2, are applied to a cycle counter 14 which operates in a well known manner to provide an output binary number at output 16 which indicates the rotary position of the shaft 2. Thus, the number output by the cycle counter 14 increments or decrements, according to the direction of rotation of the shaft 2 by unity at the completion of a cycle in the waveform A1, the other waveform A2 being utilised to determine the direction of rotation.

In order to provide for resolution of the position of the shaft 2 to fractions of each cycle in waveform A1, the outputs of the transducers 10 and 12 are applied to an interpolator 18. This comprises a matrix circuit 20 which receives the waveforms A and derives from them, by adding one to the other in different proportions, a set of ten sine waves B0 to B9 shown at B in FIG. 2. These have the same frequency as the waves A1 and A2 and are equispaced from each other in phase so that the ten zero crossing points of the ten waves B0 to B9 represent respectively twenty equispaced positions of the shaft 2 within each cycle of the wave A1 and therefore within each cycle of the grating 6. The waveforms B0 to B9 are output by the matrix in parallel and applied to respective ones of a bank of ten comparators 22 each being arranged to output a binary 1 when the respective input wave B0 to B9 has a value above zero and to output binary 0 otherwise. These binary outputs appear on lines C0 to C9 and have the values shown in the Table C of FIG. 2 for each of the twenty positions of the shaft 2 in each full cycle of the grating. In Table C, these twenty positions are labelled as positions 0 to 19 in the top line of the table and the comparator outputs C0 to C9 for any given position can be observed by reading down the column in the table corresponding to that position. From this table, it will be seen that the position of the shaft 2 can be determined by examining the comparator output C0 to C9 to locate two adjacent comparators of which one has an output of binary 1 and the other an output of binary 0. Thus, by way of example, if comparator 3 has an output of binary 1 and comparator 4 an output of binary 0, the shaft is in position 3. If the shaft moves to position 4, comparator output C4 changes to a binary 1 so that this position is indicated by comparator output C4 being binary 1 and comparator output C5 being binary 0. Thus, determination of positions 0 to 9 is made by tracking boundary 24 between the group of "0"s 26 and the group of "1"s 28. Similarly, positions 10 to 19, in the second half of cycle A1 are determined by tracking boundary 30 between the group of "1"s 28 and the group of "0"s 32. This tracking is performed by a data selection circuit 34, logic 36 and counter circuits 38 which output at 40 a binary number indicating which of positions 0 to 19 the shaft 2 is located in.

Figure 3:
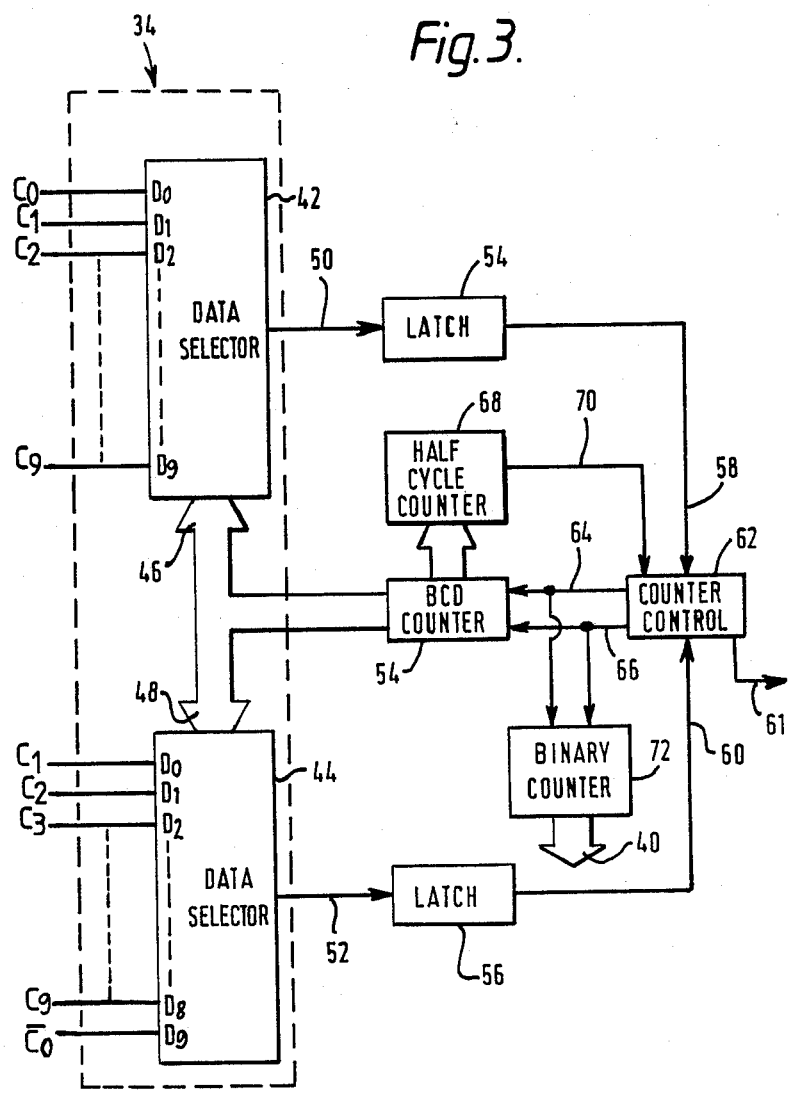
FIG. 3 is a block diagram showing in more detail a preferred form of part of the apparatus shown in FIG. 1.

As shown in FIG. 3, the data selection circuit 34 comprises two data selections 42 and 44 each having ten data inputs D0 to D9. Signals C0 to C9 are applied to inputs D0 to D9 respectively of selector 42. Signals C1 to C9 are also applied respectively to the inputs D0 to D8 of selector 44. Input D9 of selector 44 receives the inversion $\overline{C0}$ of signal C0. Circuits 42 and 44 have respective address inputs 46, 48 and respective data outputs 50, 52. Utilising the address inputs 46, 48, the signal applied to any one of the inputs D0 to D9 of each selector 42, 44 may be selected for application to the respective output 50, 52. The address inputs 46 and 48 are both connected to the output of a binary coded decimal counter 54 so that, at all times, selectors 42 and 44 apply to their respective outputs 50 and 52 signals from corresponding inputs D0 to D9. Thus, if counter 54 addresses inputs D2 of the selectors 44, signal C2 appears on output 50 and signal C3 appears on output 52. By causing counter 54 to count up or count down so as to address the inputs D0 to D9 in sequence, the position of the boundary 24 or 30 of the table of FIG. 2 can be located.

The signals appearing on lines 50 and 52 are supplied, via latches 54 and 56, to respective inputs 58, 60 of a counter control circuit 62. If the shaft is in one of positions 1 to 9, i.e. within the first half of cycle A1, and the counter control circuit 62 detects a binary 1 on each of its inputs 58 and 60, it outputs a signal on line 64 to cause BCD counter 54 to count up by unity and this is repeated until a binary 0 appears on input 60. In this way, inputs D0 to D9 are addressed in turn until the location of the boundary 24 is encountered. Similarly, again assuming that the shaft is in one of positions 1 to 9, if the counter control circuit 62 receives "0"s on both of its inputs 58 and 60, it outputs a signal on line 66 to cause the counter 54 to count down by unit, this again being repeated until the boundary 24 is located. If the counter control circuit 62 receives a 1 on input 58 and an 0 on input 60, the count in counter 54 is not changed.

If the shaft is in one of positions 10 to 19 i.e. a position corresponding to the second half of cycle A1, the logic of counter control circuit 62 is reversed i.e. it should issue an instruction to BCD counter 54 to count down in response to a 1 on each of its inputs 58, 60 and to count up in response to an 0 on each of its inputs 58, 60. A half cycle counter 68 determines from the number in BCD counter 54 whether the position is within the first half or the second half of cycle A1 and outputs an appropriate instruction to control circuit 62 via line 70.

It will be appreciated from consideration of FIGS. 2 and 3 that when the half cycle counter 68 indicates that the position is within the first half of cyle A1, the occurrence of a binary 0 on line 58 with a binary 1 on line 60 is indicative of an error condition. Similarly, when the half cycle counter 68 indicates a position within the second half cycle, the occurrence of a binary 1 on line 58 with a binary 0 on line 60 also indicates an error condition. In the event that such a condition arises, an error flag appears on output 61 of counter control circuit 62.

Thus, the count in counter 54 indicates which of positions 0 to 19 the shaft 2 is located in. In the embodiment shown in FIG. 3, a corresponding count is also recorded in a binary counter 72 which is caused to count downwards or upwards in response to the signals on lines 64 and 66 respectively, in order to provide an output in pure binary form indicative of the position of the shaft 2. However, the count in counter 72 will not provide an absolute indication of the position within each cycle unless circuitry is provided for ensuring that the actual number stored in binary counter 72 is equal to that stored in BCD counter 54. Whilst this can easily be achieved, it is not necessary in many applications since any spurious pulse applied to binary counter 72 via either of its input lines 64 or 66 will be simultaneously applied to BCD counter 54 and then automatically corrected for. If, however, an absolute indication of position within each cycle is needed, this can be obtained from the output of BCD counter 54.

As already described, input D9 of selector 44 receives the signal $\overline{C0}$. Consideration of the table of FIG. 2 will show that this is necessary in order to provide an indication of position 9 and 19.

It will be apparent from consideration of the operation of the interpolator that, unlike prior art devices, it is not necessary, at start up, to load a known number into the counters with shaft 2 in a known position because, with the invention, whatever number is in the counter 54 at start up will be automatically corrected as necessary. Thus, the circuit arrangement described will ensure that the count in counter 54 provides an accurate interpolation of the absolute position of the shaft 2 within each grating cycle. As previously indicated, the count in counter 72 does not indicate absolute position since the number in the counter is dependent upon the way in which the counter settles down at start up but, thereafter, changes in the number in binary counter 72 provide accurate interpolation. In the event that the count in counter 54 does not correspond to the position of the shaft 2, for example due to movement of the shaft 2 or generation of a spurious signal resulting in a counter error, this will be detected by the occurrence of two binary "1"s or two binary "0"s on the inputs 58, 60 to the circuit 62 and both the counters 54 and 72 will be driven in the appropriate direction until the boundary 24 or 30 is located by counter 24. Thus, in the illustrated embodiment, the data selection circuit 34 and logic 38 operate to detect errors in the count and to correct for any such errors, this being achieved by examination of the actual condition of the outputs of the comparators and modifying the count if the count is inconsistent with that condition.

The invention has a wide variety of applications. Although it has been described in connection with a rotary position sensing arrangement, it is equally applicable to the sensing of the position of a linearly movable element. Other forms of optical transducer than that illustrated may be used with the invention, for example an interferometric transducer such as may be used in metrology for high resolution detection. Further, transducers other than optical transducers may be provided for generating the input sine wave or sine waves.

The invention is not restricted to sensing of position and may be applied to perform interpolation on a wide variety of input signals.

Although the illustrated embodiment assumes that the invention would be put into practice with hard wired logic, which is preferred due to the speed of operation and low cost of commercially available logic elements, it would alternatively be possible to put the invention into practice at least partly by software although this is likely to result in slower speed of response.

Although the invention has been illustrated in an interpolator, it may also be applied to other apparatus for indicating the value of a variable. However, the invention is especially advantageous when used in combination with an interpolation technique in a position encoder.

I claim:

1. Apparatus for indicating the value of a variable comprising means for deriving a series of similar signals which change cyclically as said variable changes and which have different phases; means for storing a count representing the number of said changing signals which have achieved a predetermined condition; means for determining from some of said changing signals whether said stored count represents the number of said changing signals which have actually achieved said predetermined condition and providing a result representing the outcome of said determination and count changing means responsive to said result provided by said determining means to change said count in the event that said result indicates that said count is not consistent with the number of said changing signals which have actually achieved said predetermined condition so that said count as changed is consistent with the number of said changing signals which have actually achieved said predetermined condition.

2. Apparatus for indicating the value of a variable comprising means for deriving a series of similar signals which change cyclically as said variable changes and which have different phases; means defining a threshold through which said cyclically changing signals pass; means for storing a number; means for determining the values relative to said threshold of an adjacent pair of said cyclically changing signals at a position in said series defined by said number; and means for changing said number until it defines the position of an adjacent pair of said cyclically changing signals having values above and below the threshold respectively.

3. Apparatus according to claim 2, wherein said changing means comprises a selection circuit having a plurality of input terminals each arranged to receive data dependent upon a respective different one of said cyclically changing signals, said selection circuit being controlled by said stored number to select adjacent input terminals defined by said stored number; and logic means which is operative to change the stored number in dependence upon the data applied to the selected input terminals.

4. Apparatus according to claim 3, wherein said threshold defining means comprises a plurality of comparators, each said comparator being arranged for receiving a respective one of said cyclically changing signals, comparing the received signal to said threshold and supplying a signal indicating the result of such comparison to a respective one of said input terminals.

5. Apparatus according to claim 3, wherein said selection circuit comprises two similar data selectors each having a plurality of data inputs connected to respective ones of said input terminals such that corresponding ones of said data inputs of said two data selectors are connected to adjacent ones of said input terminals, each data selector having an address input to which the stored number is applied for selecting said data inputs.

6. Apparatus according to claim 2, wherein said cyclically changing signals are sine waves.

7. Apparatus according to claim 6, wherein said threshold is the zero crossing point of said sine waves.

8. Apparatus according to claim 2, wherein said deriving means is operable to derive said series of cyclically changing signals by interpolation from a first input signal having amplitude proportional to the sine of said variable, whereby said first input signal passes through a cycle including a first half wherein the amplitude of said first input signal is positive and a second half wherein the amplitude of said first input signal is negative as said variable varies.

9. Apparatus according to claim 8, including means for controlling the direction of change of said number according to whether the interpolation is being performed in the first or second half of the cycle of said first input signal.

10. Apparatus according to claim 9, wherein said controlling means comprises a counter which determines, from said number, whether the interpolation is being performed in the first or the second half cycle of the first input signal.

11. Apparatus according to claim 8, wherein said deriving means is operable to derive said cyclically changing signals from said first input signal and from a second sinusoidal input signal varying in quadrature with said first input signal as said variable changes.

12. A position encoder comprising means for providing an input signal dependent upon movement of a member whose position is to be encoded; a position counter for providing a count dependent upon positions of said member as indicated by said input signal; and apparatus according to claim 2 arranged for receiving said input signal and providing interpolation between positions indicated by said position counter.

13. An encoder according to claim 12, comprising an optical grating and transducer means for providing said input signal.

14. An encoder according to claim 12, operable to encode rotary position.

15. An encoder according to claim 12, operable to encode linear position.

* * * * *